(12) United States Patent
Mesuda et al.

(10) Patent No.: US 12,351,455 B2
(45) Date of Patent: Jul. 8, 2025

(54) GALLIUM NITRIDE PARTICLES AND METHOD FOR PRODUCING SAME

(71) Applicant: TOSOH CORPORATION, Yamaguchi (JP)

(72) Inventors: Masami Mesuda, Kanagawa (JP); Hideto Kuramochi, Kanagawa (JP); Shinichi Hara, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 589 days.

(21) Appl. No.: 17/766,257

(22) PCT Filed: Oct. 2, 2020

(86) PCT No.: PCT/JP2020/037602
§ 371 (c)(1),
(2) Date: Apr. 4, 2022

(87) PCT Pub. No.: WO2021/070753
PCT Pub. Date: Apr. 15, 2021

(65) Prior Publication Data
US 2023/0242401 A1    Aug. 3, 2023

(30) Foreign Application Priority Data

Oct. 7, 2019  (JP) .................. 2019-184480

(51) Int. Cl.
*C01B 21/06* (2006.01)
*C04B 35/58* (2006.01)
(Continued)

(52) U.S. Cl.
CPC .......... *C01B 21/0632* (2013.01); *C04B 35/58* (2013.01); *C04B 35/622* (2013.01);
(Continued)

(58) Field of Classification Search
CPC ... C01B 21/0632; C04B 35/58; C04B 35/622; C04B 2235/3286; C04B 2235/723;
(Continued)

(56) References Cited

U.S. PATENT DOCUMENTS

2021/0139328 A1   5/2021  Mesuda et al.

FOREIGN PATENT DOCUMENTS

JP   2000198978 A   7/2000
JP    200229713 A   1/2002
(Continued)

OTHER PUBLICATIONS

Buguo Wang, Michael Callahan, John Bailey, Synthesis of dense polycrystalline GaN of high purity by the chemical vapor reaction process, Nov. 7, 2005, Journal of Crystal Growth, 286, 50-54 (Year: 2005).*

(Continued)

*Primary Examiner* — Daniel C. McCracken
*Assistant Examiner* — Joshua Maxwell Speer
(74) *Attorney, Agent, or Firm* — HAUPTMAN HAM, LLP

(57) ABSTRACT

High-purity gallium nitride particles having a low oxygen content suitable for a raw material or a sintered body is provided. Gallium nitride particles characterized in that the oxygen content is 0.5 at % or less and the total impurity amount of elements, Si, Ge, Sn, Pb, Be, Mg, Ca, Sr, Ba, Zn and Cd, is less than 10 wtppm are used.

11 Claims, 1 Drawing Sheet

(51) Int. Cl.
*C04B 35/622* (2006.01)
*C23C 14/34* (2006.01)
*C23C 16/448* (2006.01)
*H01L 21/02* (2006.01)

(52) U.S. Cl.
CPC ...... *C23C 14/3414* (2013.01); *C23C 16/4486* (2013.01); *C01P 2004/20* (2013.01); *C01P 2004/61* (2013.01); *C01P 2006/80* (2013.01); *C04B 2235/3286* (2013.01); *C04B 2235/723* (2013.01); *C04B 2235/725* (2013.01); *H01L 21/0254* (2013.01); *H01L 21/02601* (2013.01); *H01L 21/02631* (2013.01)

(58) Field of Classification Search
CPC ...... C04B 2235/725; C04B 2235/5276; C04B 35/6265; C04B 35/6268; C23C 14/3414; C23C 16/4486; C23C 14/0641; C23C 14/0617; C23C 14/3407; C01P 2004/20; C01P 2004/61; C01P 2006/80; H01L 21/0254; H01L 21/02601; H01L 21/02631
See application file for complete search history.

(56) References Cited

FOREIGN PATENT DOCUMENTS

| | | |
|---|---|---|
| JP | 2009234800 A | 10/2009 |
| JP | 2011251910 A | 12/2011 |
| JP | 2012512119 A | 5/2012 |
| JP | 2013129568 A | 7/2013 |
| JP | 201724970 A | 2/2017 |
| JP | 2019-001681 A | 1/2019 |
| WO | 2018230663 A1 | 12/2018 |
| WO | 2020075661 A1 | 4/2020 |

OTHER PUBLICATIONS

Huaqiang Wu, Janet Hunting, Kyota Uheda, Lori Lepak, Phanikumar Konkapaka, Francis J. DiSalvo, Michael G. Spencer, Rapid synthesis of gallium nitride powder, Apr. 7, 2005, Journal of Crystal Growth, 279, 303-310 (Year: 2005).*

International Preliminary Report on Patentability in PCT/JP2020/037602, dated Apr. 12, 2022, 6pp.

* cited by examiner

GALLIUM NITRIDE PARTICLES AND METHOD FOR PRODUCING SAME

RELATED APPLICATIONS

The present application is a National Phase of International Application No. PCT/JP2020/037602 filed Oct. 2, 2020, which claims priority to Japanese Application No. 2019-184480, filed Oct. 7, 2019.

TECHNICAL FIELD

The present invention relates to gallium nitride particles that are used as a raw material for a gallium nitride sintered body used in producing a gallium nitride thin film by a sputtering method.

BACKGROUND ART

Gallium nitride has gathered much interest as a raw material for an emission layer of a blue light-emitting diode (LED) or a raw material for a blue laser diode (LD), and has recently been used as a thin film or a substrate in a variety of usages including white LEDs and blue LDs; furthermore, gallium nitride is also a promising candidate for a material for usages such as power devices in the future.

One method for producing a gallium nitride thin film is a sputtering method that uses a target. A sputtering target of gallium nitride is prepared by molding or sintering a gallium nitride powder; therefor, if the oxygen content in the gallium nitride powder used as the raw material for the target is high, a gallium nitride film having a high oxygen content is obtained, which leads to an issue of lower crystallinity. In the past attempts to decrease the oxygen content, the particle size has increased, and, particularly, in an attempt to obtain a sintered body larger than 120 mm, issues arise in that the strength has been insufficient and the shape could not be retained. Furthermore, for use in various devices, the gallium nitride sputtering target used as a raw material is required to have a high purity in order to control the amount of various dopants; however, it has not been possible to produce such a sintered body.

In general, there is known, as the method for producing a gallium nitride powder, a method for obtaining polycrystalline gallium nitride by heating metallic gallium to 1000° C. or higher and 1200° C. or lower in an ammonia gas stream. According to this method, since gallium nitride forms on the surface of metallic gallium, this gallium nitride obstructs the contact between ammonia gas and the metallic gallium inside, and thus the nitriding reaction proceeds no further. Moreover, since the melting point of metallic gallium is as low as about 30° C., metallic gallium is in a liquid state during the nitriding process and the progress of the reaction is inhibited due to less reactive surface.

Another method is a method for obtaining gallium nitride by heating gallium oxide in an ammonia gas atmosphere (for example, see PTL 1 and PTL 2). Here, X-ray fluorescence or an electron probe micro analyzer (EPMA) is used to identify that the obtained substance is gallium nitride; however, there is no mention of the minute impurity amounts in the powder or the detailed disclosure regarding the ammonia gas atmosphere.

Furthermore, still another method is available for obtaining a gallium nitride powder (for example, see PTL 3); however, according to this method, it has been difficult to obtain a powder having a certain oxygen content or less.

PTL 4 discloses a technique of obtaining a gallium nitride powder by nitriding $Ga_2O$ gas which has been obtained by vaporizing gallium oxide in a reducing atmosphere; however, a large amount of oxygen is contained in the gas used as the gallium source, and it has not been possible to obtain a powder that achieves both a low oxygen content and a high purity.

In addition, although PTL 5 discloses a technique related to gallium nitride particles having a low oxygen content, a high-purity powder has not been obtained since deposition is not performed after vaporization.

CITATION LIST

Patent Literature

PTL 1: Japanese Unexamined Patent Application Publication No. 2002-29713
PTL 2: Japanese Unexamined Patent Application Publication No. 2000-198978
PTL 3: Japanese Unexamined Patent Application Publication No. 2013-129568
PTL 4: Japanese Unexamined Patent Application Publication No. 2009-234800
PTL 5: International Publication No. 2018-230663

SUMMARY OF INVENTION

Technical Problem

An object of the present invention is to provide gallium nitride particles that have a low oxygen content and contain little impurities, with which a low-oxygen, high-density, and high-purity gallium nitride sputtering target or gallium nitride single crystals can be produced.

Solution to Problem

Under such circumstances, the inventors of the present invention have conducted extensive studies and reviewed the nitriding conditions, have found conditions under which high-purity, low-oxygen-content gallium nitride particles can be obtained, and thus have made the present invention.

That is, the gist of the present invention is as follows.

(1) Gallium nitride particles characterized in that an oxygen content is 0.5 at % or less, and a total impurity amount of elements, Si, Ge, Sn, Pb, Be, Mg, Ca, Sr, Ba, Zn and Cd, is less than 10 wtppm.

(2) The gallium nitride particles described in (1), characterized in that a total impurity amount of Mg and Si is less than 5 wtppm.

(3) The gallium nitride particles described in (1) or (2), characterized in that an Si impurity amount is less than 1 wtppm.

(4) The gallium nitride particles described in any one of (1) to (3), characterized in that the oxygen content is 0.1 at % or less.

(5) A method for producing the gallium nitride particles described in any one of (1) to (4), the method comprising: performing a nitriding process using gallium oxide as a starting material; and then performing a deposition process that involves introducing a transport ammonia gas heated to a temperature of 1150° C. or higher and 1300° C. or lower to the nitrided gallium oxide heated to 1150° C. or higher and 1300° C. or lower and depositing the vaporized gallium nitride by introducing a deposition ammonia gas heated to 900° C. or higher and 1100° C. or lower.

(6) A sintered body comprising the gallium nitride particles described in any one of (1) to (4).

(7) A sputtering target obtained by using the sintered body described in (6).

(8) A thin film obtained by using the sputtering target described in (7).

Advantageous Effects of Invention

A high-purity gallium nitride target having a low oxygen content can be produced and a highly crystalline gallium nitride thin film can be formed by using the gallium nitride particles of the present invention. In addition, the gallium nitride particles of the present invention can be applied to a material for gallium nitride single crystals produced by an ammonothermal method or the like.

DESCRIPTION OF EMBODIMENTS

Figure 1:
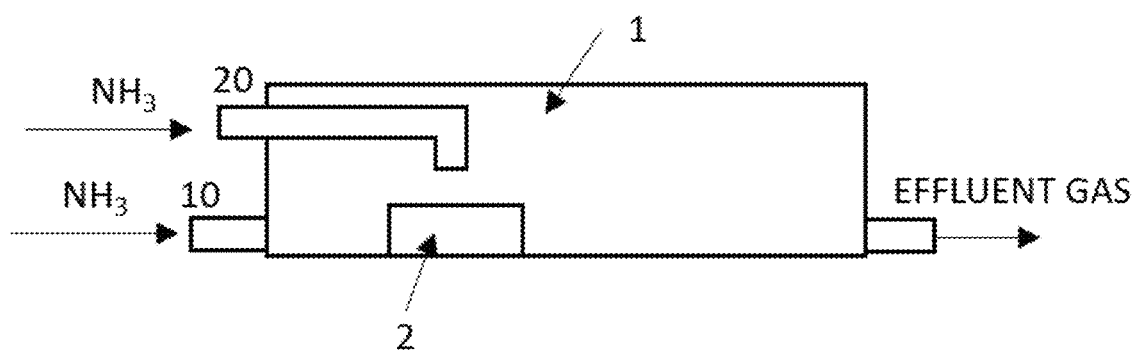
FIG. 1 One example of a device for producing gallium nitride particles of the present invention.

Although the present invention is described in detail below, the present invention is not limited to these embodiments.

The gallium nitride particles of the present invention are characterized in that the oxygen content is 0.5 at % or less, preferably 0.2 at % or less and yet more preferably 0.1 at % or less. In this manner, the oxygen content in a gallium nitride sintered body after sintering can be decreased.

The gallium nitride particles of the present invention are characterized in that the total impurity amount of elements, Si, Ge, Sn, Pb, Be, Mg, Ca, Sr, Ba, Zn and Cd, is less than 10 wtppm. The listed elements are dopants used to make a p-type or n-type semiconductor of gallium nitride, and, in order to control the dopant, must not be contained in gallium nitride particles used as a raw material. The total impurity amount is preferably 5 wtppm or less, more preferably 3 wtppm or less, yet more preferably 1 ppm or less and still more preferably 0.5 ppm or less.

The total amount of Mg and Si, which have high activation ratios among these impurities, is preferably 5 wtppm or less, more preferably 2 wtppm or less, yet more preferably 1 wtppm or less and still more preferably 0.5 ppm or less. Furthermore, the Si impurity amount is preferably 1 wtppm or less and more preferably 0.5 ppm or less.

Regarding the gallium nitride particles of the present invention, a 50% particle size of primary particles of substantially spherical gallium nitride particles is preferably 5 μm or less and more preferably 3 μm or less. In this manner, the substantially spherical gallium nitride particles can fully exhibit effects of low oxygen and high sinterability.

The average particle size of the gallium nitride particles of the present invention is preferably 20 μm or less, more preferably 1 μm or more and 20 μm or less, 1 μm or more and 10 μm or less and particularly preferably 1 μm or more and 8 μm or less. In this manner, particles suitable for densification upon firing are obtained.

The 50% particle size of the primary particles of the gallium nitride particles of the present invention is preferably 5 μm or more and 50 μm or less, preferably 7 μm or more and 40 μm or less and yet more preferably 10 μm or more and 30 μm or less. Adjusting the particle size to 5 μm or more can decrease the influence of the surface oxidation, can further decrease the oxygen content and can improve the density upon sintering. Moreover, small surface layer can suppress decomposition that typically occurs at high temperature to a certain degree, and can increase the firing temperature. Adjusting the particle size to 50 μm or less increases the surface and accelerates sintering. Here, the particle size refers to a 50% particle size for the areas of primary particles observed with a scanning electron microscope or the like.

Regarding the shape of gallium nitride of the present invention, particles having a large particle size preferably have a plate shape. This is because, unlike typical crystal growth that occurs from a substrate as a starting point, growth occurs from particles as a starting point, and thus plate-like growth in the lateral direction mainly occurs rather than the columnar growth along the c-axis. Since the ultimate shape to be obtained by sintering is a plate shape, a plate shape is preferable to a columnar shape.

The untapped density is preferably larger than 1.2 g/cm$^3$, more preferably larger than 1.4 g/cm$^3$ and yet more preferably larger than 1.6 g/cm$^3$. In this manner, the filling ability is high, densification is easily achieved upon sintering, and in using as a raw material for single crystals, the occupied volume is small and size reduction of the container can be achieved.

Next, a method for producing gallium nitride particles of the present invention is described.

A method for producing gallium nitride particles of the present invention relates to a method for obtaining gallium nitride particles by performing a nitriding process using gallium oxide as a starting material, and then performing a deposition process that involves introducing a transport ammonia gas heated to a temperature of 1150° C. or higher and 1300° C. or lower to the nitrided gallium oxide heated to 1150° C. or higher and 1300° C. or lower and depositing the vaporized gallium nitride by introducing a deposition ammonia gas heated to 900° C. or higher and 1100° C. or lower.

The purity of gallium oxide used in the present invention is preferably 4N (99.99%) or higher and more preferably 5N (99.999%) or higher. Gallium nitride particles having a higher purity can be obtained by increasing the purity of gallium oxide used.

The nitriding process temperature for gallium oxide during the nitriding process is preferably 1000° C. or higher and 1100° C. or lower and more preferably 1025° C. or higher and 1075° C. or lower. By performing the process in the range, gallium oxide can be nitrided while suppressing vaporization.

The processing time in the nitriding process is preferably 3 hours or longer and more preferably 6 hours or longer in order to complete nitridation. At the aforementioned nitriding process temperature, decomposition does not progress substantially and thus the yield does not change substantially; however, in view of the balance between the productivity and the effects achieved by nitriding, the time is preferably within 60 hours.

The ammonia gas flow rate during the nitriding process is preferably such that the nitrogen in ammonia gas/gallium in gallium oxide molar ratio is 5 or more and more preferably 10 or more since, during the nitriding process, the reaction is carried out to induce nitriding without decomposition into gallium. Furthermore, regarding the ammonia gas flow rate during the nitriding process, the molar ratio of the ammonia gas reaction amount per hour to the amount of gallium injected is preferably 1 or more, more preferably 1.5 or more and particularly preferably 2 or more; and when the ammonia gas flow rate during this nitriding process is within the aforementioned range, the vaporization reaction of gallium oxide and decomposition reaction of the synthesized gallium nitride can be suppressed.

After performing the nitriding process, a deposition process is further performed in which a transport ammonia gas heated to 1150° C. or higher and 1300° C. or lower is introduced to the nitrided gallium oxide heated to 1150° C. or higher and 1300° C. or lower. The temperature of the transport ammonia gas is preferably 1150° C. or higher and 1200° C. or lower. By performing the process in this range, higher-purity, vaporized gallium nitride particles can be obtained without decomposition into nitrogen and gallium. Without the use of the transport ammonia gas, gallium nitride decomposes into nitrogen and gallium, and the desired product cannot be obtained.

The length of time for which the transport ammonia gas is introduced to the nitrided gallium oxide heated to 1150° C. or higher and 1300° C. or lower is preferably 3 hours or longer and more preferably 6 hours or longer. If the length of time is shorter than the aforementioned length, the deposition amount decreases, the yield decreases, the particle growth does not proceed, and oxidation of the particle surfaces is accelerated during collecting; thus, it becomes difficult to obtain gallium nitride particles having the specified oxygen content. The upper limit is preferably 30 hours or shorter and more preferably 20 hours or shorter. When the length of time exceeds this, coarse particles grow, and particles suitable for the usage are not obtained.

In the deposition process, after the transport ammonia gas is introduced to the nitrided gallium oxide, a deposition ammonia gas heated to 900° C. or higher and 1100° C. or lower is further introduced to the vaporized gallium nitride to induce deposition. Vaporized gallium nitride particles can be deposited by introducing the deposition ammonia gas. The key is to carry out deposition by using an ammonia gas. Simply decreasing the temperature inside the furnace induces preferential deposition on the furnace walls, and a large amount of impurities originating in the furnace materials would be contained. Moreover, if a reactive gas such as an ammonia gas is absent during deposition, metallic gallium and gallium oxide may deposit due to nitrogen deficiency. The ammonia gas used for deposition must be sprayed to the deposition sites within 30 seconds from reaching the specified temperature. When an ammonia gas is exposed to 1000° C. or higher for a long time, the ammonia gas separates into nitrogen and hydrogen, active species (such as $NH_2$) needed for the reaction with gallium are no longer obtained, and thus the deposition reaction does not proceed. Furthermore, at a low temperature, the particles become finer, and the oxygen content cannot be maintained.

When the temperature of the deposition ammonia gas is as described above, particles can grow without re-decomposition. It becomes possible to increase the purity of the gallium nitride particles by performing deposition and particle growth after vaporization of the gallium nitride particles. In order to further increase the purity, a substrate, seed crystals, etc., of gallium nitride particles are preferably absent at deposition sites. When a substrate, seed crystals, etc., are present, oxygen and impurities derived therefrom become mixed, and it becomes difficult to obtain high-purity gallium nitride particles. Moreover, when growth occurs on a substrate, the grown substance does not assume a particle form and thus a post-process such as grinding becomes necessary, which causes mixing of impurities. The particles thus deposited have a large untapped density, and serves as a material more useful as a material for producing a sintered body or synthesizing single crystals.

The position where the vaporized gallium nitride particles are to be deposited is dependent on the inlet port of the ammonia gas and thus can be set freely. An example of the introduction method is illustrated in FIG. 1.

The length of time for the deposition process is preferably 3 hours or longer and more preferably 6 hours or longer. If the length of time is shorter, the deposition amount decreases, the yield decreases, the particle growth does not progress, and oxidation of the particle surfaces is accelerated during discharging; thus, it becomes difficult to obtain gallium nitride particles having the specified oxygen content. The upper limit is preferably 30 hours or shorter and more preferably 20 hours or shorter. When the process is conducted longer than this, coarse particles grow and particles suitable for the usage are not obtained.

The temperature of the deposition ammonia gas used to deposit the vaporized gallium nitride is 900° C. or higher and 1100° C. or lower, which is the temperature range in which the gallium nitride particles can be deposited, and is preferably 1000° C. or higher and 1100° C. or lower. By introducing the deposition ammonia gas in such a temperature range, vaporized gallium nitride particles are cooled with the deposition ammonia gas and are deposited. Furthermore, the deposited gallium nitride particles can grow to the specified particle size. The amount of the ammonia gas for this process in terms of the flow rate per hour is preferably such that the nitrogen in ammonia gas/gallium in container molar ratio is 1 or more, more preferably 2 or more and particularly preferably 3 or more.

The outermost surfaces of the particles deposited as such may be decomposed and may have metallic gallium deposited thereon. Deposition of metallic gallium gives curves on the particle surfaces and thus oxidation from the outermost surfaces can be suppressed. As a result, the color becomes close to gray.

In order to remove water generated during the nitriding process, a temperature lower than or equal to the temperature of the nitriding process step is preferably retained for several hours between the nitriding process step and the step of introducing an introduction ammonia gas to the nitrided gallium oxide.

Since the gallium nitride particles of the present invention have a low oxygen content, a sintered body having a low oxygen content can be formed. A sintered body can be obtained by, for example, hot-pressing the gallium nitride particles of the present invention at a temperature of 1060° C. or higher and lower than 1200° C. The hot pressing method involves a device that induces sintering by applying temperature to a powder while pressing, and since diffusion of elements inside a material to be treated is assisted during firing by performing uniaxial pressing during heating, even a material that is difficult to sinter can be sintered, such as when elements having low diffusion coefficients are contained or when a powder having a large particle size is to be processed. Firing by a hot pressing method improves density compared to related art, and, for example, a sintered body having a density as high as 3.0 $g/cm^3$ or higher can be obtained.

A sintered body formed of the gallium nitride particles of the present invention has a low oxygen content and thus can be used as a sputtering target having a low oxygen content. A sputtering target can be obtained by fixing (bonding) onto a plate-shaped or cylinder-shaped support with an adhesive such as a solder material. The material for the support is not particularly limited as long as the material has a high thermal conductivity and a strength to support the molded product, and metals such as Cu, SUS, and Ti are preferable for their high thermal conductivity and high strength. As for the shape of the support, a plate-shaped support is used for a plate-shaped molded product, and a cylinder-shaped support is used for a cylinder-shaped molded product. The adhesive material (bonding material) used to bond the molded product and the support is not particularly limited as long as the adhesive material has an adhesive strength sufficient for support, and an electrically conductive resin, a tin solder material, or an indium solder material can be used. Due to high electrical conductivity, high thermal conductivity, flexibility and deformability, indium solder is preferable.

A sputtering target obtained by using a sintered body formed of the gallium nitride particles of the present invention can form a gallium nitride thin film having good crystallinity since the oxygen content is low.

EXAMPLES

Although the present invention is specifically described through the examples below, the present invention is not limited to these examples.
(Measuring Oxygen Content in Particles)

A subject substance was thermally decomposed and the oxygen content was measured by a thermal conductivity method with an oxygen-nitrogen-hydrogen analyzer (produced by LECO CORPORATION). Since what is calculated is in wt %, oxygen content (at %)=(oxygen content (wt %)/oxygen atomic weight)/(nitrogen content (wt %)/nitrogen atomic weight)+(gallium content (wt %)/gallium atomic weight)+(oxygen content (wt %)/oxygen atomic weight))

The nitrogen content (wt %) was measured by using the oxygen-nitrogen-hydrogen analyzer (produced by LECO JAPAN CORPORATION), and the gallium content (wt %) was calculated as the balance of oxygen and nitrogen.
(50% Particle Size)

For the 50% particle size of the primary particles, the particle size distribution as a whole was determined by performing observation with a SEM first at a magnification of 50× to determine the presence/absence of particles over 100 μm and the diameter and area thereof, then at a magnification of 200× to determine the presence/absence of particles of 10 to 100 μm and the diameter and area thereof, then at a magnification of 1000× to determine the presence/absence of particles of 5 to 10 μm and the diameter and area thereof, and finally at a magnification of 5000× to determine the presence/absence of particles less than 5 μm and the diameter and area thereof, measuring these for at least three images, and combining the results. The particles here were those in which no grain boundaries were observed, and aggregated particles with grain boundaries were counted as separate particles. The diameter of the particles at 50% cumulation of the area ratio among these was assumed to be the 50% particle size of the primary particles.
(Average Particle Size)

For the average particle size, the particle size distribution as a whole was determined by performing observation with a SEM first at a magnification of 50× to determine the presence/absence of particles over 100 μm and the diameter thereof, then at a magnification of 200× to determine the presence/absence of particles of 10 to 100 μm and the diameter thereof, then at a magnification of 1000× to determine the presence/absence of particles of 5 to 10 μm and the diameter thereof, and lastly at a magnification of 5000× to determine the presence/absence of particles less than 5 μm and the diameter thereof, measuring these for at least three images, and combining the results. The particles here were those in which no grain boundaries were observed, and aggregated particles with grain boundaries were counted as separate particles. The arithmetic mean diameter of these particles was assumed to be the average particle size.
(Ammonia Gas/Gallium Molar Ratio)

The ratio between the number of moles of gallium in the injected gallium oxide or gallium nitride particles and the number of moles (25° C. volume-based amount) of ammonia gas calculated from the flow rate and the distribution time was used for calculation.
(Ammonia Gas ($NH_3$) Reaction Amount Per Hour)

The ammonia gas reaction amount per hour was calculated from (ammonia gas/gallium molar ratio)/reaction retention time.
(Untapped Density)

The untapped density of the gallium nitride particles was measured in accordance with JIS Z 2504.
(Measuring Impurity Amount in Particles)

Impurities in the particles were analyzed by glow discharge mass spectrometry (GDMS).

Examples 1 to 3

A tube furnace illustrated in FIG. 1 was used as the device. 40 g of a gallium oxide powder (5N: acicular) was weighed and placed in an alumina container, the alumina container was placed in a container 2 of a tube furnace 1 illustrated in FIG. 1, and the nitriding process was performed. After vacuum-purging the interior of the furnace, an ammonia gas was filled, an ammonia gas for the nitriding process was introduced through a pipe 10 at 1000 mL/min, the temperature of the container 2 was elevated 10° C./min eventually to 1050° C., and then the temperature was retained for 18 hours (ammonia gas/gallium molar ratio=103.5). After the temperature was temporarily dropped to lower than 200° C., a deposition process was further conducted in which a transport ammonia gas was introduced from the pipe 10 at 1000 mL/min, the temperature was elevated at 10° C./min, an introduction ammonia gas was introduced to nitrided gallium oxide heated to 1150° C. to vaporize gallium nitride, a deposition ammonia gas heated to 1000° C. was introduced as the deposition ammonia gas to the vaporized gallium nitride at 1000 mL/min through a pipe 20 after the position of the container 2 was heated to 1150° C., and retention was continued for 1 hour, 6 hours or 12 hours (ammonia gas/injected gallium molar ratio: 1 hour process: 5.75, 6 hour process: 34.5, 12 hour process: 69). Gallium nitride particles deposited directly on the container 2 were collected, and the yield and the physical properties were examined. The physical property values of the obtained gallium nitride particles are shown in Tables 2 and 3.

Example 4

Figure 2:
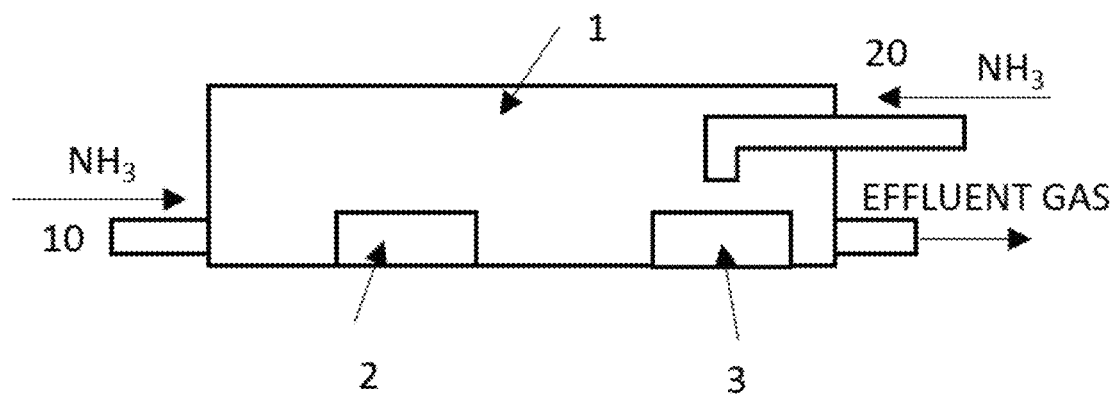
FIG. 2 One example of a device for producing gallium nitride particles of the present invention.

A tube furnace illustrated in FIG. 2 was used as the device. 40 g of a gallium oxide powder (5N: acicular) was weighed and placed in an alumina container, the alumina container was placed in a position represented by 2 in a tube furnace 1 illustrated in FIG. 2, and a nitriding process was performed. After vacuum-purging the interior of the furnace, an ammonia gas was filled, an ammonia gas for the nitriding process was introduced through a pipe 10 at 1000 mL/min, the temperature of the container 2 was elevated at 10° C./min eventually to 1050° C., and then the temperature was retained for 18 hours (ammonia gas/gallium molar ratio=103.5). After the temperature was temporarily dropped to lower than 200° C., a deposition process was further conducted in which a transport ammonia gas was introduced through the pipe 10 at 500 mL/min, the temperature was elevated at 10° C./min, the transport ammonia gas was introduced to nitrided gallium oxide heated to 1150° C. to vaporize gallium nitride, a deposition ammonia gas heated to 1000° C. was introduced to the vaporized gallium nitride at 1000 ml/min through the pipe 20 after a position of container 3 was heated to 1150° C., and the retention was continued for 6 hours (ammonia gas/injected gallium molar ratio: 6 hour process: 34.5). The particles deposited on the container 3 were collected, and the yield and the physical properties were examined. The physical property values and the yield of the obtained gallium nitride particles are shown in Table 2.

Example 5

A tube furnace illustrated in FIG. 1 was used as the device. 40 g of a gallium oxide powder (5N: acicular) was weighed and placed in an alumina container, the alumina container was placed in the container 2 portion of the tube furnace 1 illustrated in FIG. 1, and a nitriding process was performed. After vacuum-purging the interior of the furnace, an ammonia gas was filled, an ammonia gas for the nitriding process was introduced through the pipe 10 at 1000 mL/min, the temperature of the container 2 was elevated at 10° C./min eventually to 1050° C., and the temperature was retained for 18 hours. Without dropping the temperature, a deposition process was further conducted in which a transport ammonia gas was introduced through the pipe 10 at 1000 mL/min, the temperature was elevated at 10° C./min, an introduction ammonia gas was introduced to nitrided gallium oxide heated to 1150° C. to vaporize gallium nitride, a deposition ammonia gas heated to 1050° C. was introduced as the deposition ammonia gas to the vaporized gallium nitride at 1000 ml/min through the pipe 20 after the container 2 portion was heated to 1150° C., and the retention was continued for 6 hours (ammonia gas/injected gallium molar ratio: 6 hour process: 34.5). The gallium nitride particles deposited directly on the container 2 were collected, and the yield and the physical properties were examined. The physical property values of the obtained gallium nitride particles are shown in Tables 2 and 3.

Comparative Example 1

Gallium oxide was processed by using the device illustrated in FIG. 1 as in Examples 1 to 3 except that the temperature of the container used in the deposition process and the temperature for introducing the transport ammonia gas were changed to 1200° C. and the ammonia gas was introduced not through the pipe 20 but through the pipe 10 at 1000 ml/min. In such a case, since a deposition ammonia gas was not used, gallium nitride particles did not remain in the container 2, and deposited gallium nitride particles were obtained near the furnace core pipe at the exit of the pipe furnace; however, the average particle size was small, the oxygen content and the purity were low since the particles were deposited on the furnace core pipe, and thus, the desired particles were not obtained. The physical property values of the obtained gallium nitride particles are shown in Tables 2 and 3.

Comparative Example 2

Gallium oxide was processed as in Comparative Examples 1 except that the temperature of the container used in the deposition process and the temperature for introducing the transport ammonia gas were changed to 1125° C., the ammonia gas was introduced not through the pipe 20 but through the pipe 10 at 1000 ml/min, and the heat treatment was performed for 6 hours. The physical properties were measured, but since vaporization and deposition did not occur, the average particle size was large, the amount of impurities was large, and the desired particles were not obtained. The physical properties of the obtained gallium nitride particles are shown in Tables 2 and 3.

Comparative Example 3

Gallium oxide was processed as in Examples 1 to 3 except that the deposition process was omitted. Although gallium nitride particles were obtained, the average particle size was small, the oxygen content was high, the purity was low, and thus the desired particles were not obtained due to omission of the deposition process. The physical property values of the obtained gallium nitride particles are shown in Tables 2 and 3.

TABLE 1

| | | | | | | | | | | |
|---|---|---|---|---|---|---|---|---|---|---|
| | | | | Production conditions in deposition step | | | | | | |
| | | NH3 reaction | Introduction NH3 gas | | Deposition NH3 gas | | Container 2 | Container 3 | Reaction | Temperature elevation |
| | NH3/Ga molar ratio | amount per hour | Pipe No. | Temperature (°C) | Pipe No. | Temperature (° C.) | temperature ° C. | temperature ° C. | time hr | rate ° C./min |
| Example 1 | 5.75 | 5.75 | 10 | 1150 | 20 | 1000 | 1150 | — | 1 | 10 |
| Example 2 | 34.5 | 5.75 | 10 | 1150 | 20 | 1000 | 1150 | — | 6 | 10 |
| Example 3 | 69 | 5.75 | 10 | 1150 | 20 | 1000 | 1150 | — | 12 | 10 |
| Example 4 | 69 | 5.75 | 10 | 1200 | 20 | 1000 | 1200 | 1150 | 12 | 10 |
| Example 5 | 34.5 | 5.75 | 10 | 1150 | 20 | 1050 | 1150 | — | 6 | — |
| Comparative Example 1 | 69 | 5.75 | 10 | 1200 | — | — | 1200 | — | 12 | 10 |

TABLE 1-continued

Production conditions in deposition step

| | NH3/Ga molar ratio | NH3 reaction amount per hour | Introduction NH3 gas Pipe No. | Introduction NH3 gas Temperature (°C) | Deposition NH3 gas Pipe No. | Deposition NH3 gas Temperature (°C.) | Container 2 temperature °C. | Container 3 temperature °C. | Reaction time hr | Temperature elevation rate °C./min |
|---|---|---|---|---|---|---|---|---|---|---|
| Comparative Example 2 | 34.5 | 5.75 | 10 | 1125 | — | — | 1125 | — | 6 | 10 |
| Comparative Example 3 | — | — | — | — | — | — | — | — | — | — |

TABLE 2

Physical properties of collected gallium nitride particles

| | Oxygen content at % | Oxygen content wt % | 50% particle size μm | Average particle size μm | Untapped density g/cm3 |
|---|---|---|---|---|---|
| Example 1 | 0.09 | 0.04 | 16 | 4.6 | 1.4 |
| Example 2 | 0.07 | 0.03 | 22 | 8 | 1.63 |
| Example 3 | 0.07 | 0.03 | 12 | 4 | — |
| Example 4 | 0.12 | 0.05 | 24 | 17 | 1.2 |
| Example 5 | 0.14 | 0.06 | 40.6 | 11.4 | 1.76 |
| Comparative Example 1 | 8.8 | 3.5 | <0.1 | <0.1 | 0.7 |
| Comparative Example 2 | 0.09 | 0.04 | 65 | 13 | — |
| Comparative Example 3 | 1.1 | 0.45 | 0.3 | <0.1 | 1.1 |

TABLE 3

Impurity amount in collected gallium nitride particles

| Element | Unit | Example 1 | Example 3 | Example 5 | Comparative Example 1 | Comparative Example 2 | Comparative Example 3 |
|---|---|---|---|---|---|---|---|
| Si | wtppm | 0.35 | 0.08 | 0.2 | 32 | 12 | 17 |
| Ge | wtppm | <0.01 | <0.01 | <0.01 | <0.01 | <0.01 | <0.01 |
| Sn | wtppm | <0.005 | <0.005 | <0.005 | <0.005 | <0.005 | <0.005 |
| Pb | wtppm | <0.005 | <0.005 | <0.005 | <0.005 | <0.005 | <0.005 |
| Mg | wtppm | 0.42 | 0.11 | 0.03 | 12 | 0.17 | 0.22 |
| Ca | wtppm | 0.61 | 0.24 | <0.005 | 6 | 0.46 | 0.12 |
| Sr | wtppm | <0.005 | <0.005 | <0.005 | 0.2 | <0.005 | <0.005 |
| Ba | wtppm | <0.005 | <0.005 | <0.005 | 0.04 | <0.005 | <0.005 |
| Zn | wtppm | <0.005 | <0.005 | 0.008 | <0.005 | <0.005 | <0.005 |
| Cd | wtppm | <0.005 | <0.005 | <0.005 | <0.005 | <0.005 | <0.005 |
| Total | ppm | 1.38 | 0.43 | 0.238 | 50.24 | 12.63 | 17.34 |

Measured element: Si, Ge, Sn, Pb, Be, Mg, Ca, Sr, Ba, Zn and Cd

REFERENCE SIGNS LIST

1 heating furnace
2 gallium oxide packing container
3 deposited gallium nitride particle collecting container
10 pipe
20 pipe Although the present invention has been described in detail through specific embodiments, it would be obvious for a person skilled in the art that various modifications and alterations are possible without departing from the scope and spirit of the present invention.

It should noted that the present application is based on Japanese Patent Application (No. 2019-184480) filed Oct. 7, 2019, the entire contents of which are hereby incorporated by reference. Moreover, all references referred herein are incorporated as a whole.

The invention claimed is:

1. Gallium nitride particles characterized in that an oxygen content is 0.5 at % or less, and a total impurity amount of elements, Si, Ge, Sn, Pb, Be, Mg, Ca, Sr, Ba, Zn and Cd, is less than 10 wtppm, and an Si impurity amount is less than 1 wtppm.

2. The gallium nitride particles according to claim 1, characterized in that a total impurity amount of Mg and Si is less than 5 wtppm.

3. The gallium nitride particles according to claim 2, characterized in that the oxygen content is 0.1 at % or less.

4. The gallium nitride particles according to claim 1, characterized in that the oxygen content is 0.1 at % or less.

5. A method for producing the gallium nitride particles according to claim 1, the method comprising: performing a nitriding process using gallium oxide as a starting material; and then performing a deposition process that involves introducing a transport ammonia gas heated to a temperature of 1150° C. or higher and 1300° C. or lower to the nitrided gallium oxide heated to 1150° C. or higher and 1300° C. or lower and depositing the vaporized gallium nitride by introducing a deposition ammonia gas heated to 900° C. or higher and 1100° C. or lower.

6. A sintered body comprising the gallium nitride particles according to claim 1.

7. A sputtering target obtained by using the sintered body according to claim 6.

8. A thin film obtained by using the sputtering target according to claim 7.

9. The gallium nitride particles according to claim 1, characterized in that the total impurity amount of elements, Si, Ge, Sn, Pb, Be, Mg, Ca, Sr, Ba, Zn and Cd, is 0.238 wtppm or more.

10. The gallium nitride particles according to claim 1, characterized in that the Si impurity amount is 0.08 wtppm or more.

11. Gallium nitride particles characterized in that an oxygen content is 0.5 at % or less,
   wherein the gallium nitride particles comprise an Si impurity, and an Si impurity amount is less than 1 wtppm.

\* \* \* \* \*